US008727656B2

(12) United States Patent
Lohman (10) Patent No.: US 8,727,656 B2
(45) Date of Patent: May 20, 2014

(54) METAL PROFILE, FASTENING DEVICE AND COVER COMPRISING A FASTENING SYSTEM INCLUDING THE METAL PROFILE AND THE FASTENING DEVICE

(75) Inventor: Bertil Lohman, Djupdalsvägen (SE)

(73) Assignee: Clamco Invest AB, Sollentuna (SE)

( * ) Notice: Subject to any disclaimer, the term of this patent is extended or adjusted under 35 U.S.C. 154(b) by 0 days.

(21) Appl. No.: 13/503,379

(22) PCT Filed: Oct. 21, 2010

(86) PCT No.: PCT/SE2010/051142
§ 371 (c)(1),
(2), (4) Date: May 23, 2012

(87) PCT Pub. No.: WO2011/049528
PCT Pub. Date: Apr. 28, 2011

(65) Prior Publication Data
US 2012/0224916 A1    Sep. 6, 2012

(30) Foreign Application Priority Data

Oct. 23, 2009   (SE) ...................................... 0950786

(51) Int. Cl.
*F16B 9/00*        (2006.01)
*F16B 7/18*        (2006.01)
(52) U.S. Cl.
CPC ...................................... *F16B 7/187* (2013.01)
USPC ............ 403/252; 403/255; 403/264; 403/362
(58) Field of Classification Search
CPC ...................................... F16B 7/187

USPC .................................. 403/252, 255, 264, 362
See application file for complete search history.

(56) References Cited

U.S. PATENT DOCUMENTS

| 792,979   | A | * | 6/1905  | Fulghum ....................... 403/331 |
| 3,338,602 | A | * | 8/1967  | Arnd ............................. 403/252 |
| 3,776,523 | A | * | 12/1973 | Weiland ........................ 403/252 |
| 4,218,047 | A | * | 8/1980  | Douglas ........................ 403/331 |
| 4,490,064 | A | * | 12/1984 | Ducharme .................... 403/252 |

(Continued)

FOREIGN PATENT DOCUMENTS

WO           01/91250  A1    11/2001

OTHER PUBLICATIONS

International Search Report, dated Jan. 26, 2011, from corresponding PCT application.

*Primary Examiner* — Victor MacArthur
(74) *Attorney, Agent, or Firm* — Young & Thompson (57) ABSTRACT

Metal profile (230,280) as well as with the metal profile cooperating fastening device (800,830,860), wherein the two-dimensional cross-section of the metal profile, perpendicularly to the length of the profile, includes a screw pocket (233). The screw pocket includes a hole (234), arranged to accommodate a screw which is inserted perpendicularly to the cross-section, as well as an opening (235) out from the hole, which opening is narrower than the cross-sectional dimension of the hole perpendicularly to the main direction of extension (M) of the opening, and in that the screw pocket is arranged to accommodate, and therefore to engage with, the fastening device, which fastening device can be inserted into the screw pocket perpendicularly to the cross-section and thereafter be slid in the screw pocket along the metal profile.

17 Claims, 7 Drawing Sheets

(56) References Cited

U.S. PATENT DOCUMENTS

| | | | |
|---|---|---|---|
| 4,529,332 A * | 7/1985 | Glabiszewski | 403/366 |
| 4,549,832 A * | 10/1985 | Sterl | 403/264 |
| 5,464,298 A * | 11/1995 | Schomakers | 403/252 |
| 6,682,256 B1 * | 1/2004 | Hor | 403/382 |
| 2003/0021111 A1 | 1/2003 | Miller et al. | |
| 2005/0047852 A1 * | 3/2005 | Moreland et al. | 403/252 |
| 2010/0074682 A1 * | 3/2010 | Pecar et al. | 403/362 |
| 2013/0121760 A1 * | 5/2013 | Chen et al. | 403/362 |

* cited by examiner

METAL PROFILE, FASTENING DEVICE AND COVER COMPRISING A FASTENING SYSTEM INCLUDING THE METAL PROFILE AND THE FASTENING DEVICE

The present invention relates to a fastening device in the form of a fitting for mounting of components in a metal profile, the cross-section of which has a form which allows the fitting to be fastened to the profile.

In covers for electronic equipment, such as server racks, there typically exists a plurality of electric components mounted. The components are for example circuit boards, mounting devices for hard drives, and so on, but can also be different internal or external contactors.

The outer dimensions for such covers are very often limited, which in many cases results in a lack of space among the components inside the cover. This, in combination with that the various components are often associated with certain requirements regarding their mutual geometric orientation, makes it a challenging task to select a good positioning and fastening of the components in the cover.

Moreover, many conventional fastening systems are less than perfect in that they do not offer adequate degrees of freedom when positioning the very fastening point at the cover. This results in that the freedom is limited as regards the choice of where the various components are to be positioned in the cover.

Moreover, certain components are sensitive for mechanical stress in soldering points and the like, why they sometimes must be fastened at fastening points arranged at exact positions in relation to the cover and/or to other components.

The present invention solves the above described problems.

Thus, the present invention relates to a metal profile, whose two-dimensional cross-section, perpendicularly to the length of the profile, comprises a screw pocket, whereby the screw pocket comprises a hole, arranged to accommodate a screw which is inserted perpendicularly to the cross-section, as well as an opening out from the hole, which opening is narrower than the cross-sectional dimension of the hole perpendicularly to the main direction of extension of the opening, and in that the screw pocket is arranged to accommodate, and thereby to engage with, a fastening device as recited in the claims, which fastening device can be inserted into the screw pocket perpendicularly to the cross-section and thereafter be slid in the screw pocket along the metal profile.

Furthermore, the invention relates to a fastening device cooperating with the metal profile, which fastening device comprises a non-circularly cylindrical part, whereby the fastening device is arranged to be inserted into, and engage with, a screw pocket in a metal profile according to any one of claims 1-9, in a direction which is perpendicular to the cross-section of the screw pocket, and then to be slid along the metal profile, wherein the two-dimensional cross-section of the cylinder shaped part comprises a relatively wider part which is intended to be accommodated in the hole of the screw pocket, as well as a relatively narrower part which is intended to be accommodated in the opening of the screw pocket, and wherein the fastening device also comprises a through hole comprising a first and a second end, which first end opens out outside of the screw pocket when the fastening device engages with the metal profile, and which through hole is arranged to receive a fastening means arranged to engage with the metal profile.

The invention will now be described in detail, with reference to exemplifying embodiments of the invention and to the appended drawings, where.

In all figures, the same reference numerals denote the same or corresponding parts.

Figure 1:
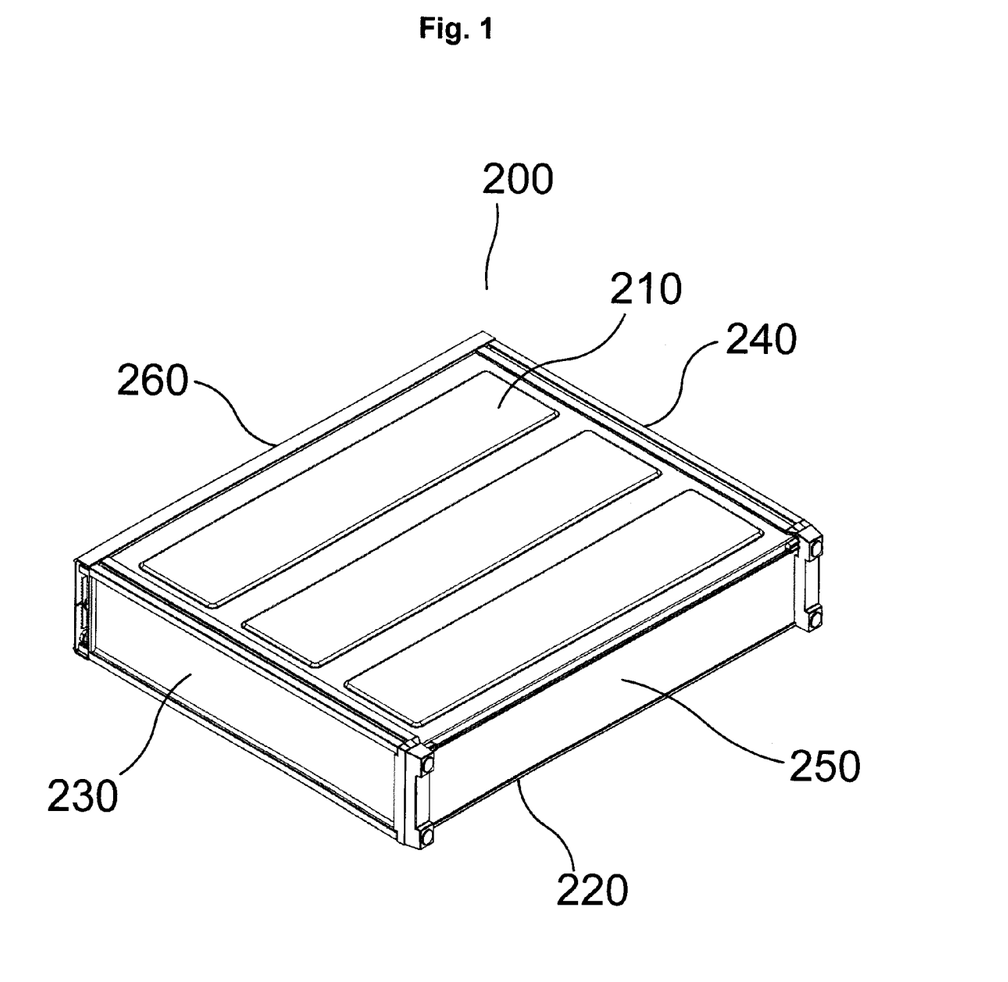
FIG. 1 is a perspective view of a cover for electronic equipment.

FIG. 1 illustrates a cover 200 for electronic equipment. The cover, which is made of electrically conducting material, preferably metal, comprises a top panel 210, a bottom panel 220, a first side panel 230, a second side panel 240, a rear panel 250 and a front panel 260.

Figure 2:
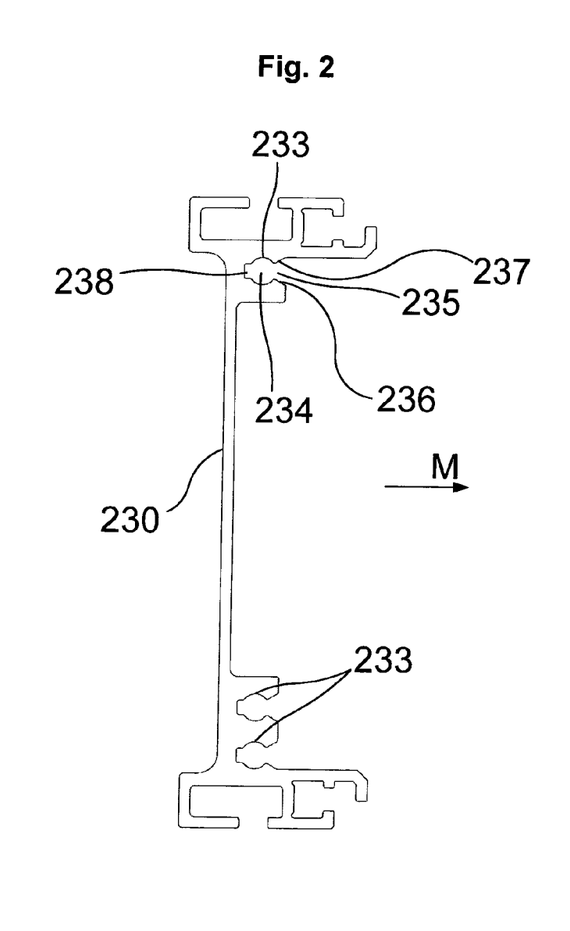
FIG. 2 is an end view of a first metal profile.
Figure 3:
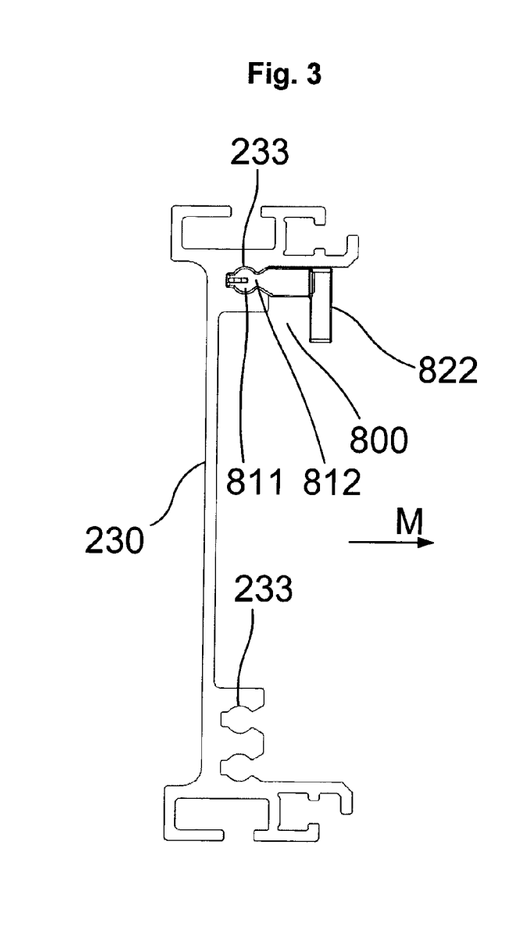
FIG. 3 is an end view of a first metal profile and a fastening device.
Figure 4:
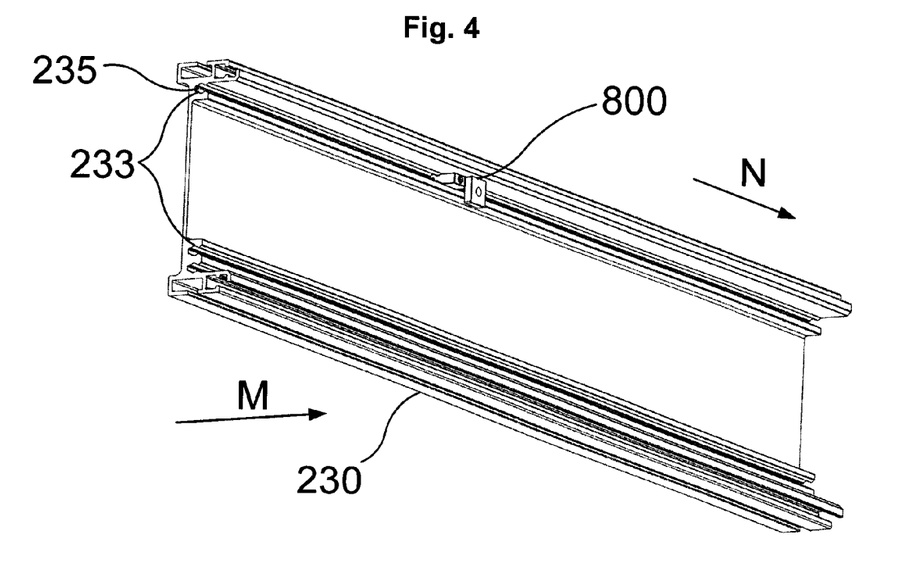
FIG. 4 is a perspective view of the metal profile and the fastening device of FIG. 3.

FIGS. 2-4 show the first side panel 230, which consists of a metal profile. The metal profile is preferably cylindrical, that is it has a two-dimensional cross-section which is constant across a profile direction N which is the main direction of extension of the profile. FIGS. 2-3 illustrate side views, in a plane which is perpendicular to the said profile direction N, of the metal profile, in which views the shape of the profile cross-section is shown. The metal profile can also be non-cylindrical, but in this case it comprises at least one cylindrical part.

According to the invention, the metal profile 230 comprises at least one screw pocket 233 in turn comprising a hole 234.

The hole is arranged to accommodate a fitting, such as a screw, that can be inserted into the hole perpendicularly to the cross-section shown in FIGS. 2 and 3, in other words in the profile direction N. It is preferred, albeit not necessary, that the metal profile 230, according to what is shown in FIG. 1, constitutes an outer wall panel in a cover for electronic equipment, and that the fitting which is inserted into the screw pocket in this case is arranged to join together the wall panel with one or several of the other parts 210, 220, 240, 250, 260 in the cover. According to another preferred embodiment, the metal profile 230 constitutes an inner wall panel in the cover. According to an especially preferred embodiment, the metal profile is an aluminum profile.

The metal profile 230 which is illustrated in FIGS. 2-4 comprises three screw pockets 233. However, it is realized that the number of screw pockets is primarily determined by the intended use of the metal profile, and that the profile of course may comprise fewer or more than three screw pockets. However, it is preferred that all screw pockets comprise fastening means for such fittings as described above, which are applied perpendicularly to the said two-dimensional cross-section, when the metal profile is arranged as a part of the context for which it is intended. In other words, there are preferably, according to the present invention, no screw pockets in the metal profile that are not also actually intended for use as screw pockets. Since each screw pocket in this case is used both for joining together of the metal profile itself with surrounding parts and for fastening of components 900 using a fastening device according to the present invention, this will result in that the surface of the metal profile is exploited in a surface efficient manner in the cover. See below for a more detailed discussion on these topics.

According to the invention, the metal profile 230, when its two-dimensional cross-section as shown in FIGS. 2 and 3 is viewed, comprises an opening 235 extending out from the hole 234 of the screw pocket 233 in an opening direction M. In other words, the screw pocket does not constitute a hole through the material of the metal profile with a closed envelope surface, but opens out from the metal profile at the elongated opening 235 and in the opening direction M. It is preferred that the direction M points in a direction towards the interior of the cover 200, so that the opening is arranged to open out inwards into the interior when the metal profile is mounted as a wall in the cover.

The opening 235 is, in said cross-section, narrower than the cross-sectional dimension of the hole 234 perpendicularly to the opening direction M. Moreover, according to the invention the screw pocket 233 is arranged to accommodate, and thereby to engage with, a fastening device 800, 830, 860 of the type defined in claim 10 and which is described in greater detail below. More precisely, the end of the screw pocket is so designed so that such a fastening device can be inserted in the profile direction N into the screw pocket, and the cross-sectional profile of the screw pocket is so shaped in relation to the cross-sectional profile of the fastening device so that the fastening device after the insertion into the screw pocket can be accommodated in and slid inside the screw pocket along the metal profile 230 in the profile direction N.

A combination of such a metal profile 230 with such a fastening device 800, 830, 860 results in a number of advantages.

Firstly, the useful surface of the metal profile, in a cover 200 in which the metal profile 230 constitutes an interior or exterior wall panel, can be exploited efficiently to fasten components 900 (see FIG. 5) in the cover, since existing screw pockets 233 are used instead of arranging additional fastening points on the metal profile.

Secondly, the flexibility regarding the fastening of components 900 in the cover 200 can be increased, since one or several fastening devices 800, 830, 860 can be arranged along each one of the existing screw pockets 233, and since the respective positioning of the fastening devices in the profile direction N can be controlled continuously by sliding each fastening device along the respective screw pocket. In other words, fastening of components with no fixed fastening points becomes possible.

According to a preferred embodiment, the screw pocket 233 is arranged so that it has a cross-section which corresponds to that for a fastening device 800, 830, 860, so that a cross-section of the fastening device is arranged to fill the screw pocket completely when the screw pocket accommodates the fastening device in question. This will eliminate any play between the profile 230 and the fastening device, which gives a more stable fastening. In case the fastening device is spring loaded (see below), a minor play can however be allowed between the interior wall of the screw pocket and the fastening device, so long as the spring load is arranged to press the fastening device against an inner wall of the screw pocket so that an engagement without play accrues.

According to a preferred embodiment, the part of the cross-section of the screw pocket 233 which does not constitute the opening 235 is non-circular. It is especially preferred that the screw pocket 233 also comprises, in addition to the hole 234 and the opening 235, a hollow 238 arranged to extend out from the hole 234 and into the metal profile 230. Such a non-circular cross-section, especially such a hollow, will allow, when combined with the corresponding protruding part 814, 844, 874 of the fastening device 800, 830, 860 (see below), that the fastening device cannot be turned about an axis in the profile direction N when the fastening device is arranged in the screw pocket, whereby a stable fastening can be achieved.

Further, it is preferred that the hollow 238 has a cornered shape in cross-section, preferably rectangular, and that one of the main axes of the hollow is parallel to the main direction of extension M of the opening in said cross-section. This has proven to result in an especially stable fastening.

On the other hand, it is preferred that the main form, in cross-section, of the hole 234 itself is circular, since this makes it possible for the hole 234 to serve as a screw pocket for a screw at its end, even if the screw pocket 233 has a constant cross-section along the profile direction N.

According to yet another preferred embodiment, the edges 236, 237 of the opening 235 are arranged to diverge along the main direction of opening 235 extension M away from the hole 234. In other words, the further away from the hole 234 one observes them, the edges are arranged further away from each other. Such design has proven to admit a stable and strong fastening of the components 900 using the fastening device 800, 830, 860. Also, with this design admits a stop screw can be arranged to lock the position of the fastening device in the profile direction N to the diverging sides 236, 237 of the metal profile 230 as described in detail below.

It is especially preferred that the edges 236, 237 of the opening 235 are straight and symmetric around the opening direction M, which simplifies the fastening in case components 900 are arranged to be mounted perpendicularly to the metal profile 230.

Figure 5:
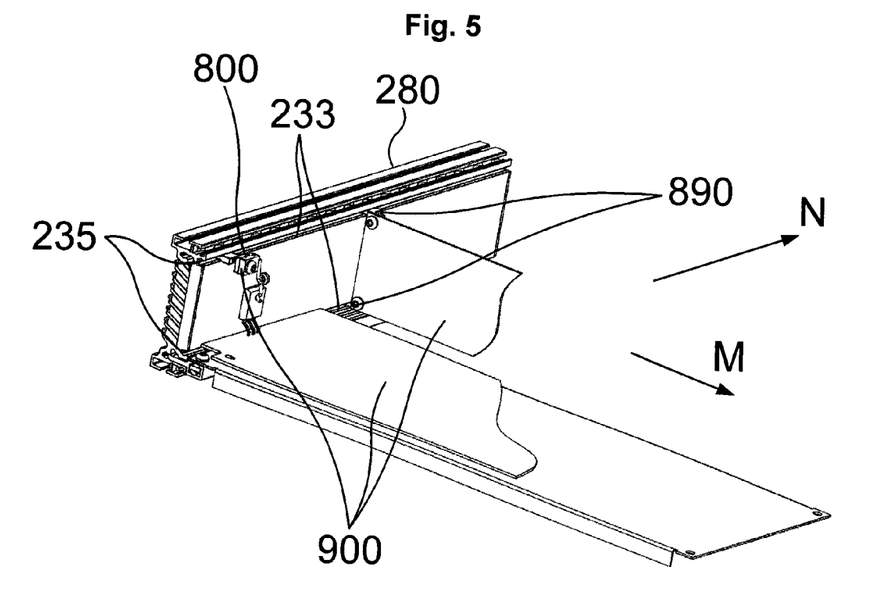
FIG. 5 is a perspective view of a second metal profile and a number of fastening devices and components.

FIG. 5 illustrates an additional metal profile 280, which, similarly to the metal profile 230, comprises several screw pockets 233 arranged to receive screws being inserted into the respective screw pocket in a direction of extension N of the metal profile. The screw pockets are arranged in accordance with the above described.

In the screw pockets 233, there are several fastening devices 800, 890, with shapes in accordance to the herein described, engaging with their respective screw pocket. As described in closer detail below, each fastening device in FIG. 5 comprises a respective fastening means, at which various components 900 are fixed at suitable positions inside the cover 200. Because of the slidability of the fastening devices along the respective screw pockets, very precise positioning of the components is achievable. This is also very advantageous in case two components which are rigidly connected to each other are to be fastened to one or several wall panels, as is illustrated at the fastening device 800 in FIG. 5.

Figure 6:
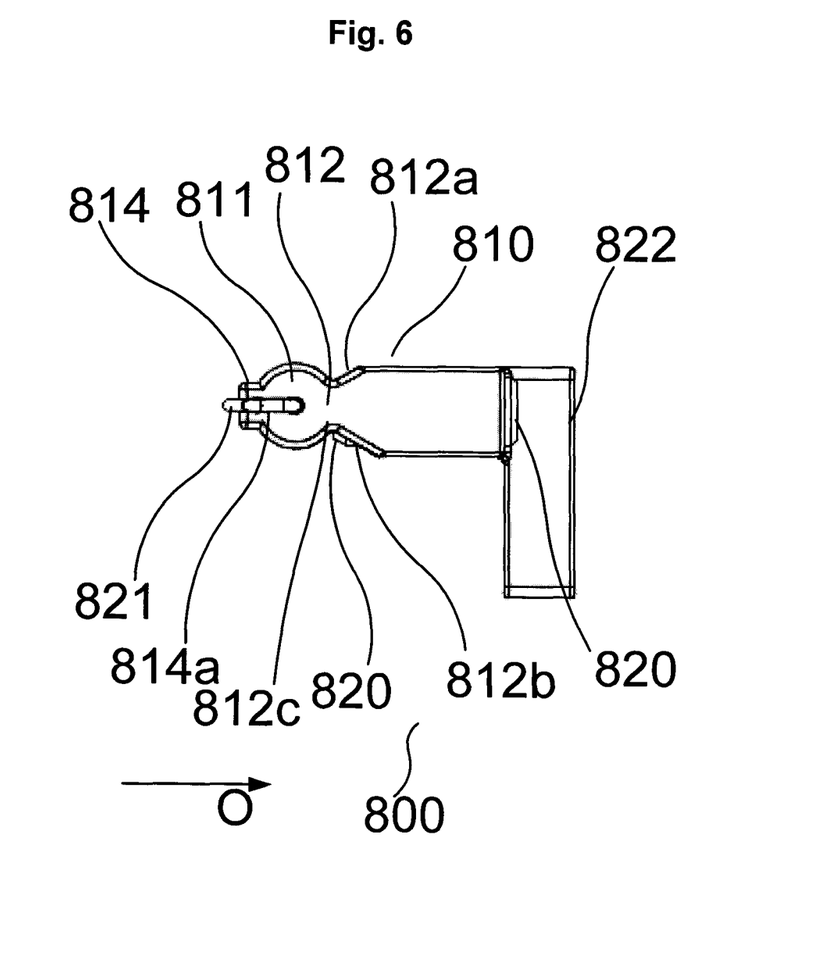
FIG. 6 is a detail view from the side of the fastening device of FIG. 3.
Figure 7A:
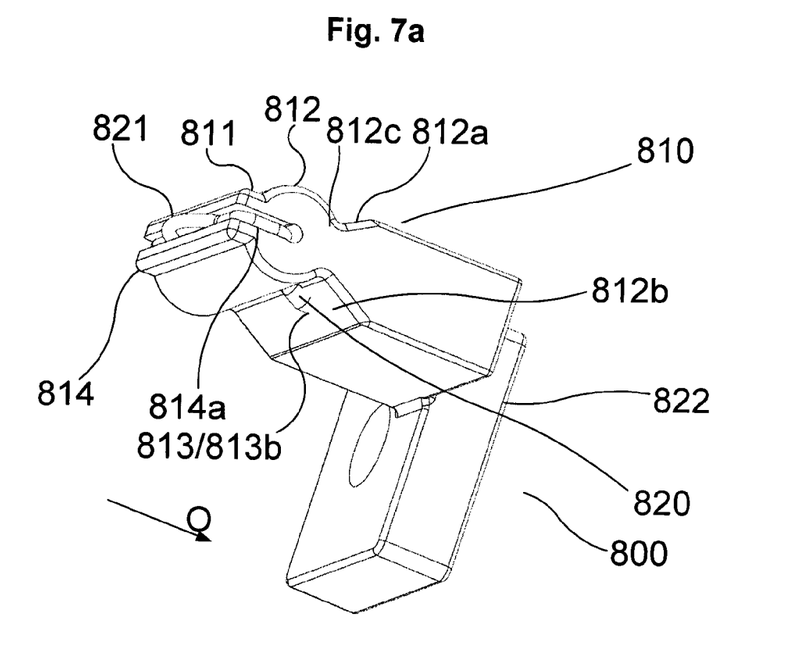
FIG. 7a is a first perspective view of a first fastening device.
Figure 7B:
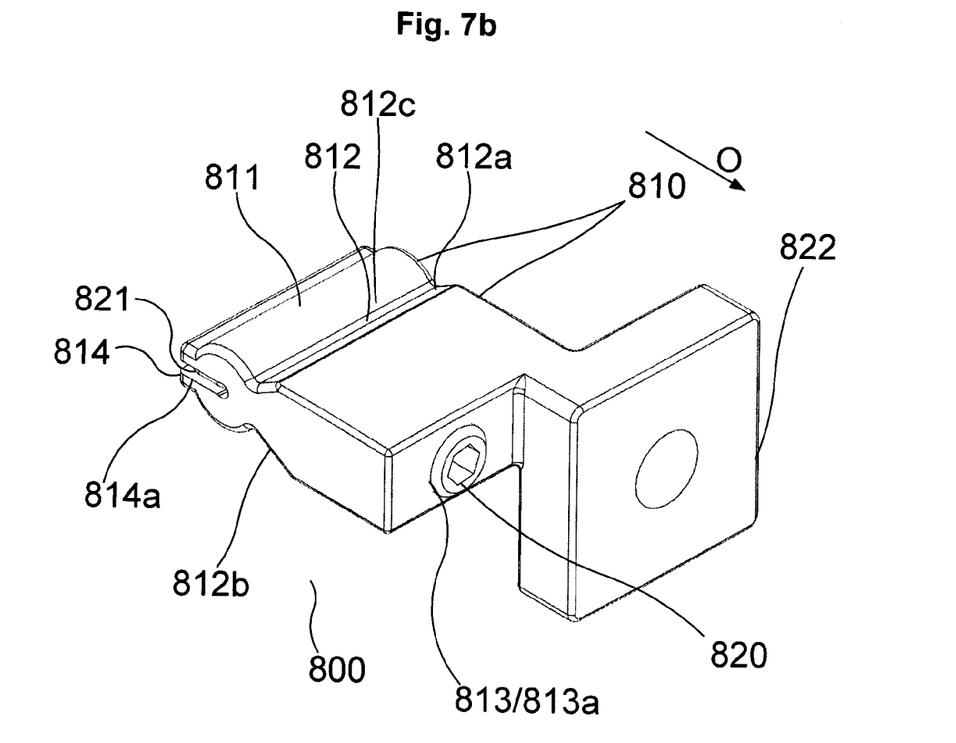
FIG. 7b is a second perspective view of the first fastening device.

FIGS. 6-7b clearer illustrate the fastening device 800 shown in FIG. 3. The fastening device comprises a non-circular cylindrical part 810, which means that the part 810 is cylindrical with a non-circular cross-section.

According to the invention, the fastening device 800 is arranged to be inserted into, and engage with, a screw pocket 233 in such a metal profile 230, 280 as has been described above. Thus, the fastening device is arranged to be inserted into the screw pocket, with one of said basis surfaces first and in a profile direction N which is perpendicular to the cross-section of the screw pocket shown in FIG. 6. Then, the fastening device is arranged to be slid along the metal profile in the said profile direction to a desired position.

The two-dimensional cross-section of the cylindrical part 810, perpendicular to the profile direction N when the fastening device 800 engages with the screw pocket 233, comprises a relatively wider part 811 and a relatively narrower part 812. The relatively wider part is arranged to be accommodated in, and engage with, the hole 234 of the screw pocket when the fastening device engages with the screw pocket. The relatively narrower part 812 is arranged to simultaneously be accommodated in, and engage with, the opening 235 of the screw pocket when the fastening device engages with the screw pocket.

Moreover, the fastening device 800 comprises a through hole 813, comprising a first end 813a and a second end 813b. The first end 813a opens out above the screw pocket 233 when the fastening device engages with the metal profile 230, and the through hole 813 is arranged to receive a fastening means 820 arranged to engage with the metal profile.

The fastening device 800 is thus arranged to be inserted in, and slid along, a screw pocket 233 in a metal profile 230, 280 as described above. The engagement between the fastening means and the screw pocket, in which the relatively wider part 811 cooperates with the hole 234 and in which the relatively narrower part 812 cooperates with the opening 235, and which is therefore arranged to lock the fastening device in a direction of rotation about an axis which coincides with the profile direction N, can be arranged so that a stable and non-rotatable, but slidable, engagement between screw pocket and fastening device can be achieved. When the fastening device has been slid to the correct position, it can be fixed by activating the fastening means 820 against the material of the metal profile and thereby become completely fixed in relation to the profile.

Furthermore, such a fastening device 800 can be arranged with a limited extension outside of the screw pocket 233. For example, the protruding part can as a whole essentially be composed of a fastening means 822 for components 900, outside of the screw pocket, which admits very surface efficient exploitation of the metal profile 230, 280 for fastening of components 900 inside the cover 200.

It is very preferred that the fastening device 800 is arranged so that its cross-section completely fills the cross-section of the screw pocket 233 when the screw pocket accommodates the fastening device. In connection herewith, it is preferred that the fastening device is arranged not to display any play in relation to the screw pocket when the parts engage with each other, why the cross-section of the fastening device can be arranged to fill the screw pocket completely except a limited part which does not allow any play between screw pocket and fastening device. Alternatively, a certain play can be accepted if the fastening device is spring loaded.

It is preferred that the fastening device is made from a good electric conductor such as stainless steel, which also yields very good strength, or zinc, which in many applications yields sufficient strength. It is also preferred that the fastening means is manufactured by casting. In the case with stainless steel, it is preferred to use so called MIM casting, which gives very fine dimension tolerances. In the case of zinc casting, a cheaper component can be obtained which on the other hand has weaker strength than stainless steel.

Moreover, it is preferred that the cross-section of the cylinder-shaped part 810 of the fastening device 800 comprises a part 814, which protrudes out from the relatively wider part 811 and is arranged so that it can engage with the corresponding cavity 238 in the cross-section of the screw pocket 233, which in turn extends out from the hole 234 in the cross-section of the screw pocket according to the above.

The protruding part 814 admits improved rotational stability about an axis which is parallel to the profile direction N when the fastening device 800 engages with the screw pocket 233 and is therefore arranged to fit in the corresponding cavity 238.

Thus, it is preferred that the protruding part 814, in case the cavity 238 is rectangular, has a corresponding rectangular shape, and that one of the main axes of the protruding part in this case, in a way corresponding to the above described direction of extension in the opening direction M of the main axis of the cavity 238, is parallel to the main direction of extension O of the relatively narrower part 812, which direction of extension O during engagement between fastening device 800 and screw pocket 233 coincides with the opening direction M.

Analogously, it is preferred that the principal shape of the relatively wider part 811 is essentially circular in case the principal shape of the hole 234 is also circular, so that the relatively wider part 811 essentially fills the hole 234 completely. Moreover, it is preferred that the relatively narrower part 812 comprises edges 812a, 812b, that diverge along the main direction of extension O of the relatively narrower part 812 away from the relatively wider part 811 in a way which corresponds to the shape of the edges 236, 237 of the screw pocket 233 opening 235. Such a combination of fastening device and screw pocket gives, as described above, a very stable engagement.

It is also preferred that the edges 812a, 812b of the relatively narrower part 812 are straight and symmetric with respect to the direction of extension O in case the corresponding shape is used for the edges 236, 237 of screw pocket 233.

According to a preferred embodiment, the fastening means 820 is a stop screw, arranged to be screwed into the first end 813a of the through hole 813 from outside of the screw pocket 233 during engagement between fastening device 800 and screw pocket. In this case, the width of the stop screw is larger than the width of the relatively narrower part 812 by its connection 812c to the relatively wider part 811. When the fastening device engages with the screw pocket, and the screw has been screwed into the hole 813 all the way to the other end 813b of the hole, the stop screw is thereby arranged to apply a pressure to the walls 236, 237 in the opening 235 in the screw pocket. This way, the stop screw presses the fastening device out from the screw pocket and thereby also the relatively wider part 811 against the inner wall of the screw pocket hole 234, and thus locks, because of the increased friction, the position of the fastening device along the metal profile 230, 280.

This way, a simple and easily accessible way of quickly achieving a secure locking of the position of the fastening device 800, along the profile direction N and when the correct position is achieved, is obtained, which facilitates the assembly of components 900 in the cover 200.

Moreover, it is preferred that the fastening device 800 comprises a spring means 821, arranged by the cylindrical part 810, which spring means is arranged to apply a spring pressure to an inside of the screw pocket 233. The spring pressure is, in this case, adjusted, on the one hand, to be sufficient in order for the fastening device, because of friction against the screw pocket, not to be able to slide along the screw pocket only as a consequence of gravity in case the profile direction N has a vertical component in space, and, on the other hand, be sufficiently small for a user to be able to, using hand power, slide the fastening device along the screw pocket while overcoming friction.

Such a design admits that the fastening device 800 can be adjusted, by hand and with great control and precision, to assume a desired position along the profile direction N. Once the desired position has been occupied, the fastening device will remain in this position, with no risk of undesired displacement, while the user fixes the fastening device using the fastening means 820.

According to a preferred embodiment, the spring means 821 is arranged on a side of the cylindrical part 810 which is arranged on the opposite side from the relatively narrower part 812. In other words, the spring means is arranged on the opposite side of the relatively wider part 811 in relation to the relatively narrower part 812. In this case, the spring means is furthermore arranged to apply a pressure against an inside of the screw pocket 233, which is arranged opposite to the opening 235 of the screw pocket, in other words on the opposite side of the hole 234, when the fastening device engages with the screw pocket.

Such an arrangement admits the user to easily push the fastening device 800 along the screw pocket 233 by gripping the fastening device by its part extending out from the screw pocket.

An especially simple and stable construction can be achieved by arranging the spring means 821 in a groove 814a arranged for this purpose in the cylindrical part 810, which groove has been realized as a cavity by the cross-section of the cylindrical part comprising a cavity. This allows a low sliding friction between spring and screw pocket 233, since the spring can be shaped as an elongated, curved metal arc whose direction of elongation coincides with profile direction N.

Advantageously, the said cavity 814a is arranged so that it opens out in an edge of the protruding part 814.

It is preferred that the second end 843b of the through hole 843 opens out at the connection 812c of the relatively narrower part 812 to the wider part 811, and that its first end 843a opens out at a place outside of the screw pocket 233 during engagement between screw pocket and fastening device 800. Thereby, the user can easily access a fastening device 850 arranged in the through hole for activating against the material of the metal profile 230, 280.

As described above in connection to FIG. 5, the fastening device 800 furthermore comprises a fastening element 822, by the use of which a component 900 can be fastened to the fastening device and thereby also to the metal profile 230, 280. The fastening element can be arranged in a way which is conventional as such, such as in the form of a through hole with internal threads.

Figure 8A:
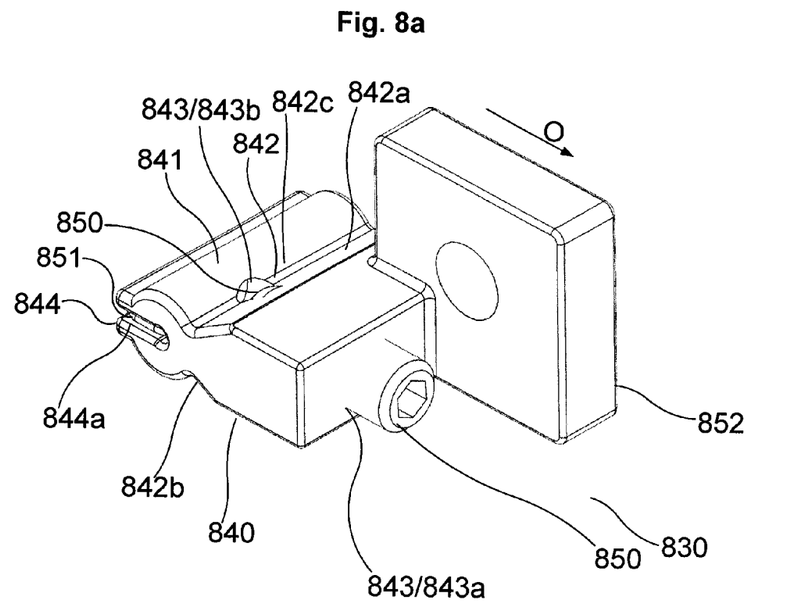
FIG. 8a is a first perspective view of a second fastening device.
Figure 8B:
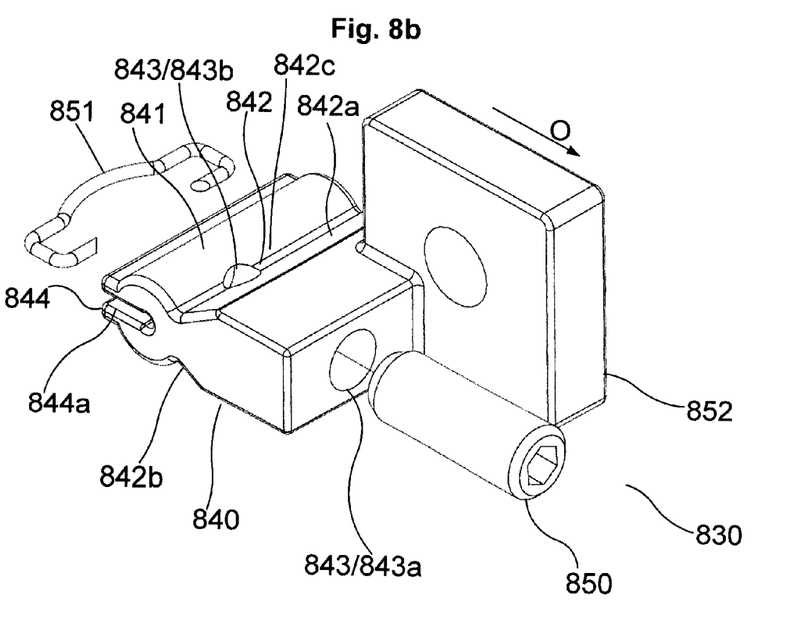
FIG. 8b is a second, partly exploded, perspective view of the second fastening device.

FIGS. 8a-8b illustrate an alternative embodiment of a fastening device 830 in accordance with the present invention. The fastening device 830 is arranged to be inserted into, engage with and fixed to a screw pocket 233 in a metal profile 230, 280 in a way which is analogous to the one described above in connection to the fastening device 800. For this purpose, the fastening device comprises a non-circularly cylindrical part 840; a relatively wider part 841 with a protruding part 844 which in turn comprises a groove 844a arranged to accommodate a spring 851; a relatively narrower part 842 comprising diverging edges 842a, 842b and a connection 842c to the relatively wider part 841; a through hole 843 with first 843a and second 843b ends; as well as a fastening device 850.

The fastening means 850, in the form of a screw (the threads are not shown), as well as the spring 851, are illustrated in FIG. 8b in an exploded state. As illustrated in FIG. 8b, the spring 851 is shaped as an elongated, bent clamp having a slightly curved and resilient part on which the contact surface to the inside of the screw pocket 233 is arranged. Moreover, the spring is arranged with two hook parts in either end of the spring, arranged to engage with corresponding sockets inside the groove 841a in order to hold the spring in place in the groove during sliding along the screw pocket.

The fastening element 822 of the fastening device 800 illustrated in FIGS. 7a-7b is perpendicular to the direction O, and comprises a hole for fastening of a component 900, which fastening hole is arranged in parallel to the direction O. The fastening device 830 does also comprises a fastening element 852, which is perpendicular to the direction O, however the fastening holes in the fastening element 852 are arranged in parallel to the direction O.

Figure 9A:
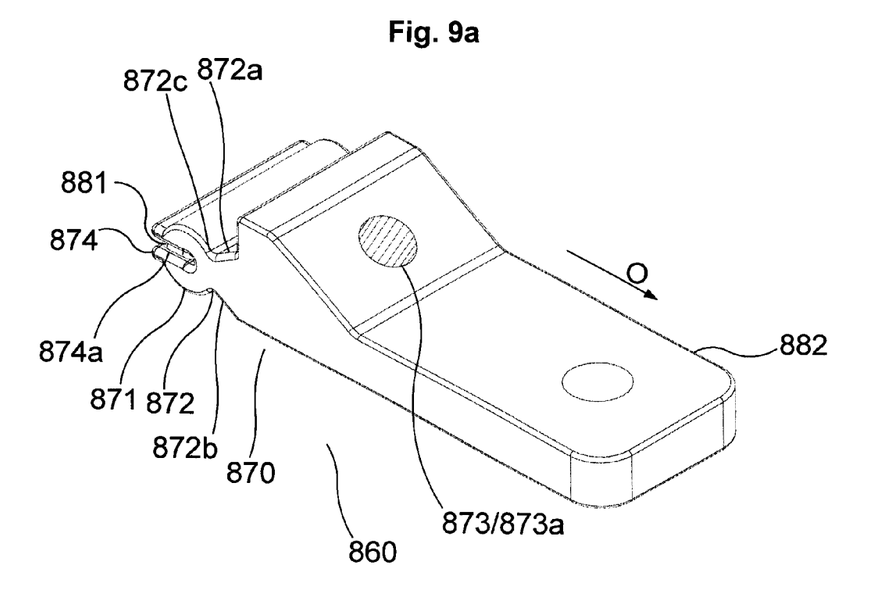
FIG. 9a is a first perspective view of a third fastening device.
Figure 9B:
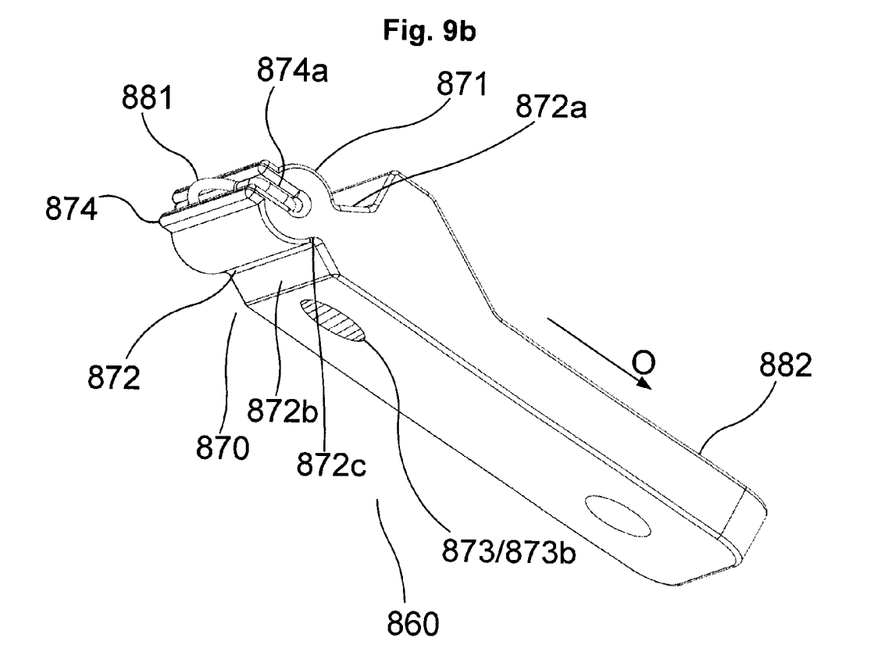
FIG. 9b is a second perspective view of the third fastening device.

FIGS. 9a-9b illustrate an additional, alternative exemplary embodiment of a fastening device 860 in accordance with the present invention. The fastening device 860 is arranged to be inserted into, engage with and fixed to a screw pocket 233 in a metal profile 230, 280, in a way analogue to the one described in connection to the fastening devices 800, 830. Thus, the fastening device 860 also comprises a non-circularly cylindrical part 870; a relatively wider part 871 with a protruding part 874 which in turn comprises a groove 874a arranged to accommodate a spring 881; a relatively narrower part 872 comprising converging edges 872a, 872b and a connection 872c to the relatively wider part 871; a through hole 873 with first 873a and second 873b ends; as well as a fastening means (not shown in FIGS. 9a-9b).

The fastening element 882 of the fastening means 860 is arranged perpendicularly to the direction O, but is, as opposed to the corresponding fastening element 822, 852 of the fastening means 800, 830, arranged as an extension of the cylindrical part 870. The fastening hole in the fastening element 882 is arranged perpendicularly to the direction O.

The various orientations for the fastening elements 822, 852, 882 illustrated in FIGS. 7a-9b and corresponding fastening holes serve to illustrate that the part of the fastening device 800, 830, 860 which is arranged to be fastened to a component 900 in the interior of the cover 200 can be designed in many different ways without departing from the basic idea of the invention regarding a strong and flexible engagement between the fastening device and a screw pocket 233 in the metal profile 230, 280. Especially, this will allow components to be fastened in different orientations inside the cover 200, which admits a freer arrangement.

The through hole 873 in the fastening device 860 is, as is shown in FIGS. 9a-9b, not parallel with the direction O, which is the case with through holes 813, 843 in the fastening devices 800 and 830, respectively. Instead, the through hole 873 is arranged at an angle in relation to the direction O out from the connection 872c of the relatively narrower part 872 to the relatively wider part 871, where the other end 873b of the hole opens out. This means that a fastening means can be inserted through the first end 873a of the hole, allowing easy access as a consequence of the orientation of the fastening element 882 in relation to the rest of the fastening device 860, and then be activated against the material of the metal profile 230, 280 at the said connection 872c.

Above, preferred embodiments have been described. However, it is apparent to the skilled person that many modifications can be made to the described embodiments without departing from the idea of the invention.

For example, the cross-section of the cylindrical part of a fastening device according to the present invention can be arranged with other non-circular geometrical shapes, which correspond to the shape of a screw pocket, than the above described ones, so long as these geometrical shapes allow an engagement between fastening means and screw pocket which is pivotally locked.

Furthermore, the spring means can be arranged differently than in the above described ways, such as for example in the form of a resilient flange constituting an integrated part of, and integrated in the same piece as, the fastening device. Moreover, the spring means can be arranged with an activation means, by the aid of which the user can choose to temporarily deactivate the friction-increasing load of the spring means against the inner surface of the screw pocket during sliding of the spring means along the screw pocket. For example, such an activation means is comprised by a pressure means which is mechanically connected to the spring means, and is arranged to pull the latter from the inner wall of the screw pocket when the pressure means is activated by the user, and again let the spring means be pressed against the inner wall when the user no longer activates the pressure means.

Moreover, the screw pocket can extend in a direction which does not coincide with the main direction of elongation of the metal profile, such as vertically in relation to the operating position of the cover, or at an angle which is not perpendicular to the main directions of extension of the metal profile.

Thus, the invention shall not be limited to the described embodiments, but can be varied within the scope of the enclosed claims.

The invention claimed is:

1. A fastening device (800,830,860), comprising:
a non-circularly cylindrical part (810,840,870),
wherein the fastening device is arranged to be inserted into, and engage with a metal profile (230,280), a two-dimensional cross-section of which metal profile, perpendicularly to a longitudinal direction (N) of the profile, comprises a hole (234) and an opening (235) out from the hole, via which the hole opens out from the metal profile,
wherein the opening in the said cross-section is narrower than a cross-sectional dimension of the hole perpendicularly to a main direction of extension (M) of the opening,
wherein said fastening device can be inserted into the metal profile in the said longitudinal direction, and then slid along the metal profile,
wherein the two-dimensional cross-section of the cylindrical part comprises a first part (811,841,871) with a first width, arranged to be accommodated in the hole in the metal profile, as well as a second part (812,841,872) with a second width, which second width is smaller than the first width, arranged to be accommodated in the opening in the metal profile,
a through hole (813,843,873) comprising a first end (813a, 843a,873a) and a second (813b,843b,873b) end, which first end opens out outside of the said hole in the metal profile when the fastening device engages with the metal profile, and which through hole is arranged to receive a fastener (820;850) arranged to engage with the metal profile,
wherein the fastener (820,850) is a stop screw arranged to be screwed in through the through hole (813,843,873), and the screw, and when screwed into the through hole, is arranged to apply a pressure to the metal profile and thereby to lock a position of the fastening device along the metal profile (230,280).

2. A fastening device (800,830,860) according to claim 1, wherein the fastening device is arranged so that its cross-section fills the cross-section of the hole (234) in the metal profile completely when the metal profile accommodates the fastening device.

3. A fastening device (800,830,860) according to claim 1, wherein the fastening device is made of stainless steel.

4. A fastening device (800,830,860) according to claim 1, wherein the cross-section of the cylindrical part (810,840, 870) further comprises a part (814,844,874) protruding from the first part (811,841,871), arranged to engage with a corresponding cavity (238) in the cross-section of the metal profile, which corresponding cavity is arranged to extend out from the hole (234) in the metal profile and into the metal profile in the cross-section of the metal profile.

5. A fastening device (800,830,860) according to claim 4, wherein the protruding part (814,844,874) is rectangular, and in that one of the main axes of the protruding part is parallel to the main direction of extension (O) of the second part (812,842,872).

6. A fastening device (800,830,860) according to claim 1, wherein the principal shape of the first part (811,841,871) is circular.

7. A fastening device (800,830,860) according to claim 1, wherein edges (812a,812b,842a,842b,872a,872b) of the second part (812,842,872) are straight and symmetric around a main direction of an extension (O) of the second part.

8. A fastening device (800,830,860) according to claim 1, wherein the fastening device further comprises a spring (821, 851,881) arranged on the cylindrical part (810,840,870), which spring is arranged to apply a spring pressure against an inside of the hole (234) in the metal profile.

9. A fastening device (800,830,860) according to claim 8, wherein the spring (821,851,881) is arranged on a side of the cylindrical part (810,840,870) which is arranged opposite to the second part (812,842,872), and in that the spring is arranged to apply a spring pressure against an inside of the hole (234) in the metal profile which is arranged opposite to the opening (235) in the metal profile when the fastening device engages with the metal profile.

10. A fastening device (800,830,860) according to claim 9, wherein the spring pressure is sufficient for the fastening device, because of a force of friction against the metal profile, not to be able to slide along the metal profile only as a consequence of gravity, and at the same time sufficiently small for a user to be able by hand power to displace the fastening device along the metal profile while overcoming the force of friction.

11. A fastening device (800,830,860) according to claim 8, wherein the spring (821,851,881) is arranged in a groove (814a,844a,874a) in the cylindrical part (810,840,870), which groove is formed as a cavity comprised in the cross-section of the cylindrical part.

12. A fastening device (800,830,860) according to claim 11, wherein the cross-section of the cylindrical part (810,840, 870) further comprises a part (814,844,874) protruding from the first part (811,841,871), arranged to engage with a corresponding cavity (238) in the cross-section of the metal profile, which corresponding cavity is arranged to extend out from the hole (234) in the cross-section of the metal profile, and wherein the cavity is arranged so that it opens out in an edge of the protruding part (814,844,874).

13. A fastening device (800,830,860) according to claim 8, wherein a spring pressure of the spring is sufficient for the fastening device, due to a force of friction against the metal profile (233), not to be able to slide along the metal profile only as a consequence of gravity, and at the same time sufficiently small for a user to be able by hand power to displace the fastening device along the metal profile while overcoming the force of friction.

14. A fastening device (800,830,860) according to claim 1, wherein the fastening device further comprises a fastening element (822,852,882), by the use of which a component (900) can be fastened to the fastening device and therefore also to the metal profile (230,280).

15. A fastening device (800,830,860) according to claim 1, wherein the second end (813b,843,873) of the through hole (813,843,873) opens out by the connection (812c,842c,872c) of the second part (812,842,872) to the first part (811,841, 871).

16. A fastening device (800,830,860) according to claim 1, wherein edges (812a,812b,842a,842b,872a,872b) of the second part (812,842,872) diverge along a main direction of extension (O) of the second part away from the first part (811,841,871), and wherein a width of the screw is larger than a width of the second part (812,842,872) at its connection (812c,842c, 872c) to the first part (811,841,871), so that the screw is arranged to apply a pressure to the walls of the said opening (235) in the metal profile which corresponds to the second part in the fastening device when the fastener engages with the metal profile and the screw has been screwed into the through hole, and thereby to lock the position of the fastening device along the metal profile (230,280).

17. A fastening device (800,830,860) according to claim 1, wherein the fastening device is comprised of zinc.

* * * * *